(12) United States Patent
Shim et al.

(10) Patent No.: US 10,121,838 B2
(45) Date of Patent: Nov. 6, 2018

(54) FLAT PANEL DISPLAY CONNECTING FRONT SIDE TO REAR SIDE OF SUBSTRATE USING THROUGH HOLE

(71) Applicant: LG Display Co., Ltd., Seoul (KR)

(72) Inventors: Jongsik Shim, Paju-si (KR); Youngjun Choi, Goyang-si (KR); Younsub Kim, Seongnam-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/701,847

(22) Filed: Sep. 12, 2017

(65) Prior Publication Data

US 2018/0114820 A1    Apr. 26, 2018

(30) Foreign Application Priority Data

Oct. 25, 2016  (KR) .......................... 10-2016-0139544

(51) Int. Cl.
*H01L 27/32*    (2006.01)
*H01L 51/00*    (2006.01)

(52) U.S. Cl.
CPC ........ *H01L 27/3248* (2013.01); *H01L 27/322* (2013.01); *H01L 27/3246* (2013.01); *H01L 27/3276* (2013.01); *H01L 51/0096* (2013.01)

(58) Field of Classification Search
None
See application file for complete search history.

(56) References Cited

U.S. PATENT DOCUMENTS

| 8,138,502 | B2* | 3/2012 | Nakamura | H01L 27/1214 257/642 |
| 2003/0122495 | A1* | 7/2003 | Nakanishi | G02F 1/13454 315/169.3 |
| 2003/0168969 | A1* | 9/2003 | Tanabe | H01L 27/3251 313/500 |
| 2010/0045919 | A1 | 2/2010 | Chida et al. | |
| 2010/0097295 | A1 | 4/2010 | Kwak | |
| 2012/0169682 | A1* | 7/2012 | Kuhlman | H01L 27/3248 345/205 |

(Continued)

FOREIGN PATENT DOCUMENTS

EP    2 472 583 A2    7/2012
JP    2002-216953 A   8/2002

(Continued)

OTHER PUBLICATIONS

The Extended European Search Report dated Apr. 5, 2018, for corresponding European Application No. 17176327.5.

(Continued)

*Primary Examiner* — Joseph Schoenholtz
(74) *Attorney, Agent, or Firm* — Morgan, Lewis & Bockius LLP

(57) ABSTRACT

The present disclosure relates to a display device including a light emitting element display. The present disclosure suggests a flat panel display comprising: a substrate; a driving element disposed on a first surface of the substrate; an organic light emitting diode disposed on a second surface of the substrate; a through-hole penetrating the substrate from the front surface to the rear surface; and a connecting electrode filling the through-hole for linking the driving element to the organic light emitting diode.

12 Claims, 7 Drawing Sheets

(56) References Cited

U.S. PATENT DOCUMENTS

| | | | | |
|---|---|---|---|---|
| 2015/0021081 A1* | 1/2015 | Mitarai | ............... | H05K 1/186 |
| | | | | 174/260 |
| 2015/0325630 A1 | 11/2015 | Yoo et al. | | |
| 2016/0351650 A1* | 12/2016 | Chang | ............... | H01L 27/3276 |

FOREIGN PATENT DOCUMENTS

| | | | |
|---|---|---|---|
| JP | 2003255850 A | 9/2003 |
| JP | 2008268713 A | 11/2008 |
| JP | 2010097925 A | 4/2010 |
| WO | 2005/053005 A2 | 6/2005 |

OTHER PUBLICATIONS

Note: U.S. 2015/0325630 cited therein is already of record. No English Translation.

* cited by examiner

FLAT PANEL DISPLAY CONNECTING FRONT SIDE TO REAR SIDE OF SUBSTRATE USING THROUGH HOLE

This application claims the benefit of Korea Patent Application No. 10-2016-0139544 filed on Oct. 25, 2016, which is incorporated herein by reference for all purposes as if fully set forth herein.

BACKGROUND

Technical Field

The present disclosure relates to a display device including light emitting element display. Especially, the present disclosure relates to a flat panel display in which an organic light emitting diode and a thin film transistor are disposed on the front surface and the rear surface respectively, and the organic light emitting diode and the thin film transistor are connected via a through hole penetrating from the front surface to the rear surface.

Discussion of the Related Art

Nowadays, various flat panel display devices are developed for overcoming many drawbacks of the cathode ray tube such as heavy weight and bulk volume. The flat panel display devices include the liquid crystal display device (or LCD), the field emission display (or FED), the plasma display panel (or PDP) and the electroluminescence device (or EL).

FIG. 1 is a plane view illustrating the structure of the organic light emitting diode display having the active switching elements such as the thin film transistors according to the related art. FIG. 2 is a cross sectional view illustrating the structure of the organic light emitting diode display along to the cutting line of I-I' in FIG. 1 according to the related art.

Referring to FIGS. 1 and 2, the organic light emitting diode display comprises a thin film transistor (or 'TFT') substrate having the thin film transistors ST and DT and an organic light emitting diode OLE connected to and driven by the thin film transistors ST and DT, and a cap ENC joining and facing the TFT substrate with an organic adhesive POLY therebetween. The TFT substrate includes a switching thin film transistor ST, a driving thin film transistor DT connected to the switching thin film transistor ST, and an organic light emitting diode OLE connected to the driving thin film transistor DT.

On a transparent substrate SUB including a glass substrate, the switching thin film transistor ST is formed where a scan line SL and a data line DL are crossing each other. The switching thin film transistor ST acts for selecting the pixel which is connected to the switching thin film transistor ST. The switching thin film transistor ST includes a gate electrode SG branching from the scan line SL, a semiconductor channel layer SA overlapping with the gate electrode SG, a source electrode SS and a drain electrode SD.

The driving thin film transistor DT acts for driving an anode electrode ANO of the pixel selected by the switching thin film transistor ST. The driving thin film transistor DT includes a gate electrode DG connected to the drain electrode SD of the switching thin film transistor ST, a semiconductor channel layer DA, a source electrode DS connected to the driving current line VDD, and a drain electrode DD. The drain electrode DD of the driving thin film transistor DT is connected to the anode electrode ANO of the organic light emitting diode OLE.

As one example, FIG. 2 shows the thin film transistor of top gate structure. In this case, the semiconductor channel layers SA and DA of the switching thin film transistor ST and the driving thin film transistor DT are firstly formed on the substrate SUB and the gate insulating layer GI covers them and then the gate electrodes SG and DG are formed thereon by overlapping with the center portion of the semiconductor channel layers SA and DA. After that, at both sides of the semiconductor channel layers SA and DA, the source electrodes SS and DS and the drain electrodes SD and DD are connected thereto through contact holes penetrating an insulating layer IN. The source electrodes SS and DS and the drain electrodes SD and DD are formed on the insulating layer IN.

In addition, at the outer area surrounding the display area where the pixel area is disposed, a gate pad GP formed at one end of the scan line SL, a data pad DP formed at one end of the data line DL, and a driving current pad VDP formed at one end of the driving current line VDD are arrayed. A passivation layer PAS is disposed to cover the upper whole surface of the substrate SUB having the switching and the driving thin film transistors ST and DT.

After that, formed are the contact holes exposing the gate pad GP, the data pad DP, the driving current pad VDP and the drain electrode DD of the driving thin film transistor DT. Over the display area within the substrate SUB, a planar layer PL is coated. The planar layer PL makes the roughness of the upper surface of the substrate SUB in much smoother condition, for coating the organic materials composing the organic light emitting diode on the smooth and planar surface condition of the substrate SUB.

On the planar layer PL, the anode electrode ANO is formed to connect the drain electrode DD of the driving thin film transistor DT through one of the contact holes. On the other hands, at the outer area of the display area not having the planar layer PL, formed are a gate pad electrode GPT, a data pad electrode DPT and a driving current electrode VDPT connected to the gate pad GP, the data pad DP and the driving current pad VDP, respectively, exposed through the contact holes. On the substrate SUB, a bank BA is formed covering the display area, excepting the pixel area.

On the bank BA and the exposed anode electrode ANO by the bank BA, an organic light emission layer OL is stacked. Then, on the organic light emission layer OL, a cathode electrode CAT is deposited. As a result, an organic light emitting diode OLED having the stacked structure of the anode electrode ANO, the organic light emission layer OL and the cathode electrode CAT is completed.

A cap TS is joining the thin film transistor substrate SUB having above mentioned structure with the constant gap therebetween. In that case, it is preferable that the thin film transistor substrate SUB and the cap TS are completely sealed by having an organic adhesive FS between them. The organic adhesive FS prevents moisture and gases from intruding into the inner space of the thin film transistor substrate. The gate pad electrode GPT and the data pad electrode DPT exposing to the exterior of the cap TS may be connected to external devices via the various connecting means.

In addition, the cap TS includes a black matrix BM disposed at the non-display area and a color filter CF disposed at the display area, on the inner side of the cap TS. Especially, in the case that the organic light emission layer OL generates the white light, the full color including red (R)-green(G)-blue(B) colors can be represented by using the color filter CF.

For the flat panel display according to the related art, all elements are formed on one surface of the substrate. For example of the organic light emitting diode display, the thin film transistors ST and DT and the organic light emitting diode OLE are sequentially stacked on one surface of the substrate SUB. Therefore, the area for the organic light emitting diode OLE would be defined within restricted some portions of the pixel area.

Further, in the organic light emitting diode display, the cathode electrode CAT is deposited over the whole of any one surface of the substrate. For the case that the cathode electrode CAT includes a metal material having lower resistance, there is no specific problem. However, for the case that the cathode electrode CAT including transparent conductive material for ensuring the high transparency, the surface resistance would be higher than using metal material. In that case, the video quality may be degraded.

For examples, when the cathode electrode CAT includes a transparent conductive material such as the indium-tin-oxide or the indium-zinc-oxide having higher resistivity (or, specific resistance) than metal materials, the surface resistance of the cathode electrode CAT is relatively high. As a result, the cathode electrode CAT may not have even voltage distribution over the whole surface of the display panel. This may cause the unevenness of the brightness or luminance of the display panel. Especially, as the area of the organic light emitting diode display is getting larger, the unevenness of the luminance or lightness may be severely caused.

In the interim, for the top emission type, an auxiliary cathode electrode may be further included for reducing the surface resistance of the cathode electrode CAT. It is preferable that the auxiliary cathode electrode includes a metal material having low resistance. As the organic light emitting layer OL is firstly disposed under the cathode electrode CAT, it is not easy to connect the cathode electrode CAT to the auxiliary cathode electrode directly. For some examples, using an additional mask process, some portions of the organic light emitting layer OL is removed. Otherwise, using a screen mask, the organic light emitting layer OL is disposed as it is not covering some portions of the auxiliary cathode electrode. In these cases, the more number of the mask process is required.

In other words, the pixel area would be divided into two areas; one area, the non-emitting area, is for the thin film transistors ST and DT, and the other area, the emitting area, is for the organic light emitting diode OLE. Further, the non-emitting area would includes various lines such as the current driving line VDD, the data line DL and the scan line SL. As the results, it is very hard to increase the aperture ratio which is the area ratio of the organic light emitting diode OLE in the pixel area. In order to the problems of the organic light emitting diode display according to the conventional art, it is required to invent a new structure of the display.

SUMMARY

Accordingly, embodiments of the present disclosure are directed to a display that substantially obviates one or more of the problems due to limitations and disadvantages of the related art.

An aspect of the present disclosure is to provide a flat panel display having a large display area and/or an ultra high pixel density. Another aspect of the present disclosure is to provide a large area and/or an ultra high density flat panel display having the high aperture ratio. Still another aspect of the present disclosure is to provide a large area and/or an ultra high density organic light emitting diode display having the high aperture ratio and high quality.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, a flat panel display comprises: a substrate; a driving element disposed on a first surface of the substrate; an organic light emitting diode disposed on a second surface of the substrate; a through-hole penetrating the substrate from the front surface to the rear surface; and a connecting electrode filling the through-hole for linking the driving element to the organic light emitting diode.

In one embodiment, the organic light emitting diode includes: an anode electrode disposed in a matrix manner on the first surface; a bank covering circumference areas of the anode electrode; an organic light emitting layer on the anode electrode exposed by the bank; and a cathode electrode disposed on the organic light emitting layer, and wherein the through-hole and the connecting electrode are disposed as overlapping with the bank.

In one embodiment, the driving element includes: a scan line running to a first direction on the second surface; a data line and a current driving line running to a second direction on the second surface; a switching thin film transistor connecting between the scan line and the data line; and a driving thin film transistor connecting between the switching thin film transistor and the current driving line, and wherein the driving thin film transistor connects to the connecting electrode.

In one embodiment, the display further comprises an en-cap joined to the first surface of the substrate; a plurality of an auxiliary line disposed on the en-cap as facing to the bank; and a color filter disposed between two neighboring auxiliary lines, wherein the auxiliary lines contact the cathode electrode.

In one embodiment, a plurality of the through-hole and the connecting electrode is disposed along to the bank.

In one embodiment, a plurality of the through-hole and the connecting electrode is disposed along to the bank covering a vertical circumference of the anode electrode. In other words, the plurality of the through-hole and the connecting electrode are disposed overlapping the bank along one side of a vertical circumference of the anode electrode.

In one embodiment, a plurality of the through-hole and the connecting electrode is disposed along to the bank covering a horizontal circumference of the anode electrode. In other words, the plurality of the through-hole and the connecting electrode are disposed overlapping the bank along one side of a horizontal circumference of the anode electrode.

In one embodiment, the through-hole includes: a first hole disposed on the first surface; and a second hole disposed on the second surface, wherein the first hole has the same size of the second hole.

In one embodiment, the through-hole includes: a first hole disposed on the first surface; and a second hole disposed on the second surface, wherein the first hole is larger than the second hole.

In one embodiment, the through-hole includes: a first hole disposed on the first surface; and a second hole disposed on the second surface, wherein the first hole is smaller than the second hole.

The flat panel display device according to some embodiments of the present disclosure comprises a display element disposed on the front surface of the substrate and a driving element disposed on the rear surface of the substrate. Therefore, the display element has the maximized area corresponding to the pixel area in spite of the arraying manner of the driving element. Further, as the driving element and the display element are formed on different surfaces from each other, any one element is not affected by the manufacturing process of the other element. Therefore, high quality of the elements can be ensured. As the through hole and the connecting element for linking the front surface and the rear surface are disposed within the non-display area such as the bank area, it is possible to get an organic light emitting diode display having the high aperture ratio and the superior quality.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION OF THE ILLUSTRATED EMBODIMENTS

Figure 1:
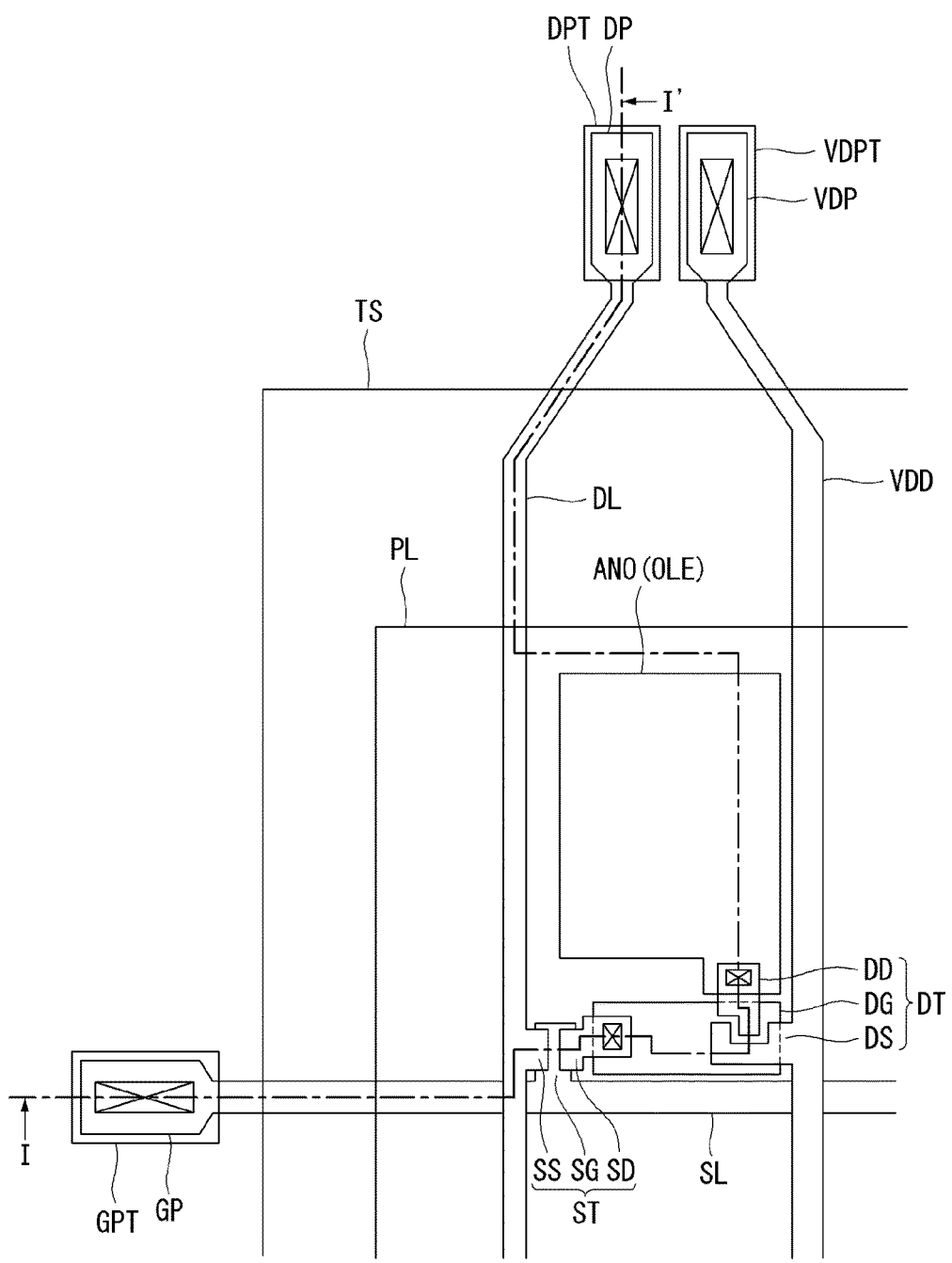
FIG. 1 is a plane view illustrating the structure of the organic light emitting diode display having the active switching elements such as the thin film transistors according to the related art.
Figure 2:
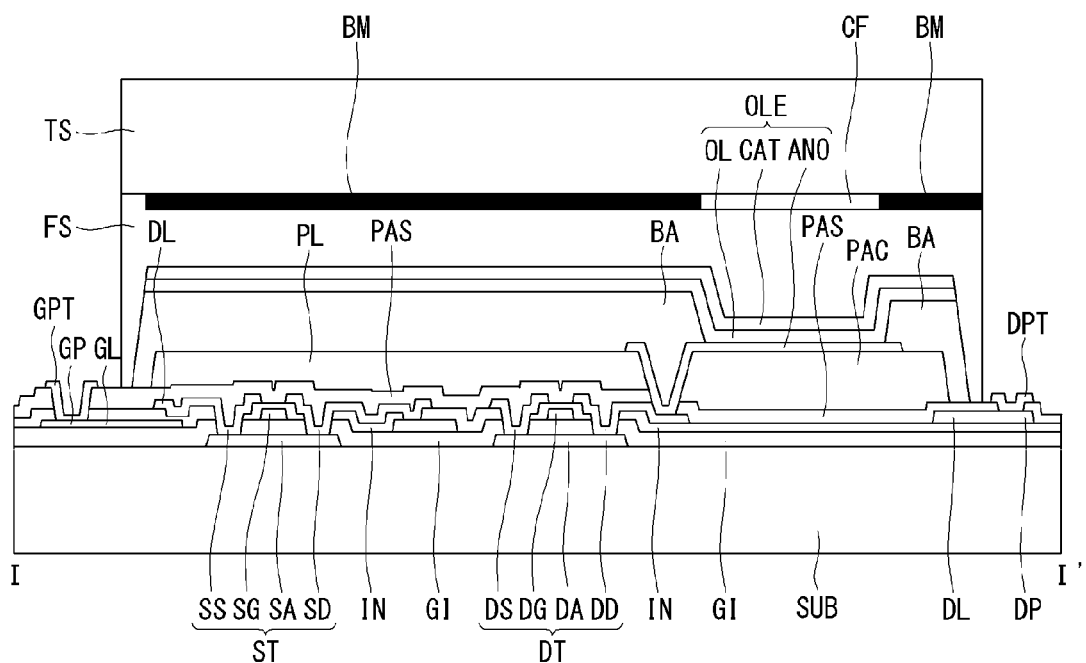
FIG. 2 is a cross sectional view illustrating the structure of the organic light emitting diode display along to the cutting line of I-I' in FIG. 1 according to the related art.

Referring to attached figures, we will explain preferred embodiments of the present disclosure. Like reference numerals designate like elements throughout the detailed description. However, the present disclosure is not restricted by these embodiments but can be applied to various changes or modifications without changing the technical spirit. In the following embodiments, the names of the elements are selected by considering the easiness for explanation so that they may be different from actual names.

First Embodiment

Figure 3:
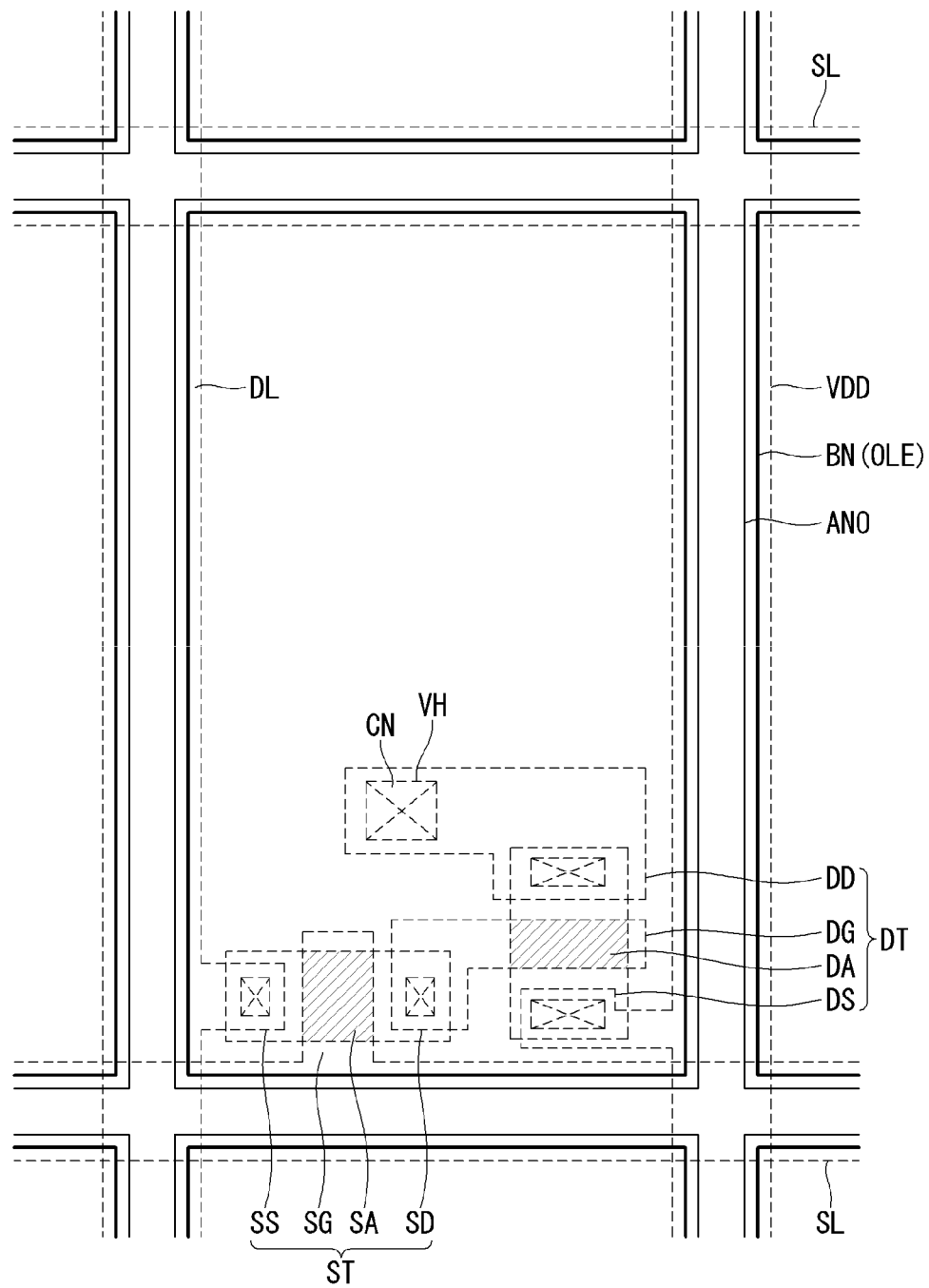
FIG. 3 is a plane view illustrating a structure of an organic light emitting diode display in which the front surface of the substrate is connected to the rear surface of the substrate via a through hole, according to the first embodiment of the present disclosure.

At first, we explain the first embodiment of the present disclosure about a flat panel display in which an organic light emitting diode disposed on the front surface of the substrate is connected to a driving element disposed on the rear surface of the substrate. FIG. 3 is a plane view illustrating a structure of an organic light emitting diode display in which the front surface of the substrate is connected to the rear surface of the substrate via a through hole, according to the present disclosure.

Referring to FIG. 3, an organic light emitting diode display according to the present disclosure includes a substrate having a front surface on which a plurality of organic light emitting diode OLE is arrayed in a matrix manner, and a rear surface on which a plurality of thin film transistors ST and DT are disposed. In the plane view, in order to distinguish the front surface from the rear surface, the elements disposed on the rear surface are drawn as the dotted or dashed lines.

On the rear surface of the substrate, a scan line SL, a data line DL and a current driving line VDD are disposed. A pixel area is defined as a rectangular shape surrounded by the scan line SL, the data line DL and the current driving line VDD. Within the pixel area, a switching thin film transistor ST and the driving thin film transistor DT are formed.

The switching thin film transistor ST includes a switching gate electrode SG, a switching source electrode SS, a switching drain electrode SD and a switching semiconductor layer SA. The switching gate electrode SG is branched from or connected to the scan line SL. The switching source electrode SS is branched from or connected to the data line DL. The switching drain electrode SD is apart from and facing to the switching source electrode SS with a predetermined distance, based on the switching gate electrode SG there-between. The switching semiconductor layer SA is disposed as crossing the switching gate electrode SG from one side connecting to the switching source electrode SS to the other side connecting to the switching drain electrode SD.

The driving thin film transistor DT includes a driving gate electrode DG, a driving source electrode DS, a driving drain electrode DD and a driving semiconductor layer DA. The driving gate electrode DG is connected to the switching drain electrode SD of the switching thin film transistor ST. The driving source electrode DS is branched from or connected to the current driving line VDD. The driving drain electrode DD is apart from and facing to the driving source electrode DS with a predetermined distance, based on the driving gate electrode DG there-between. The driving semiconductor layer DA is disposed as crossing the driving gate electrode DG from one side connecting to the driving source electrode DS to the other side connecting to the driving drain electrode DD.

The driving drain electrode DD is connected to an anode electrode ANO formed on the front surface of the substrate by a connecting electrode CN filling a through-hole VH penetrating the substrate. The anode electrode ANO has a rectangular shape occupying the maximum area of the pixel area defined on the front surface of the substrate.

The circumference portions of the anode electrode ANO is covered by a bank BN. The bank BN divides each pixel areas as disposing between two neighboring pixel areas. The middle portions of the anode electrode ANO surrounded by the bank BN is defined as the emission area. On the anode electrode ANO, an organic light emitting layer and the cathode electrode are stacked. Therefore, within the emission area, the organic light emitting diode OLE is formed as stacking the anode electrode ANO, the organic light emitting layer and the cathode electrode. The organic light emitting diode OLE surrounded by the bank defines the aperture ratio.

The organic light emitting diode display shown in FIG. 3 according to the present disclosure has a unique structure in which the organic light emitting diode OLE is formed on the front surface of the substrate and the driving elements are formed on the rear (or back) surface of the substrate. Therefore, the size and the shape of the organic light emitting diode OLE and the aperture area of the organic light emitting diode OLE are not affected by the lines or thin film transistors. As the results, the aperture ratio is maximized of the pixel area.

The through-hole VH penetrating the substrate and the connecting electrode CN filling the through-hole VH may be disposed at the middle portion of the anode electrode ANO. In such embodiment of present invention, the through-hole and the connecting electrode have provided the maximized size of the the organic light emitting diode OLE and the aperture ratio of the pixel area. However, in some particular cases, when the through-hole VH and the connecting electrode CN are disposed at the middle of the anode electrode ANO, the front surface may not have good even property enough for depositing anode electrode ANO having smooth surface condition. When the anode electrode ANO, the organic light emitting layer and the cathode electrode are stacked on the uneven surface condition, the organic light emitting diode OLE may occur unexpected defects in some particular cases.

Therefore, we will explain about some embodiments for suggesting further improved structures in which the plane condition of the anode electrode ANO is kept in highly even condition. In addition, we will suggest the improved structure for lowering the connection resistance between the anode electrode ANO and the driving drain electrode DD of the driving thin film transistor DT.

Second Embodiment

Figure 4:
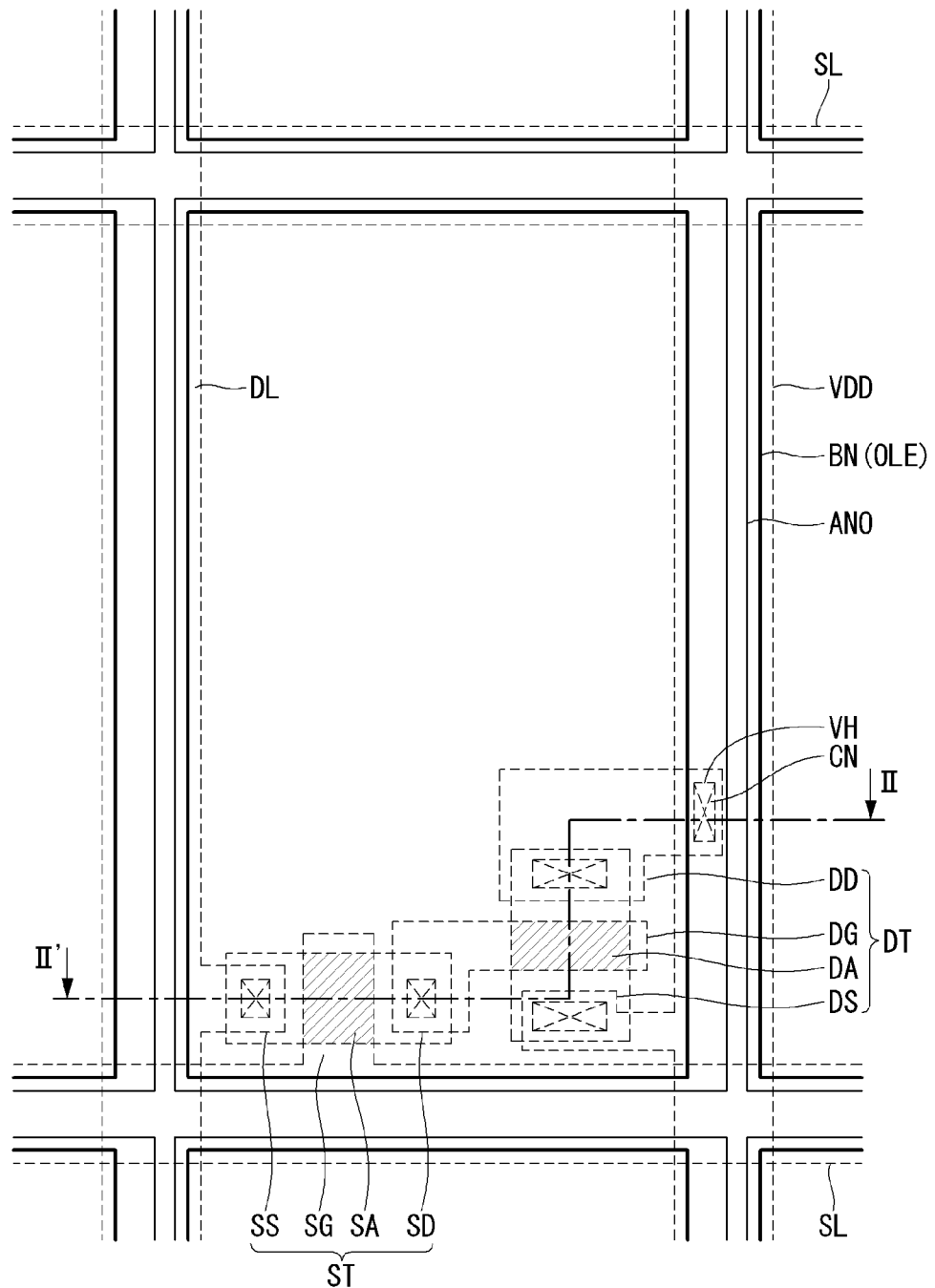
FIG. 4 is a plane view illustrating a structure of an organic light emitting diode display in which the front surface of the substrate is connected to the rear surface of the substrate via a through hole, according to the second embodiment of the present disclosure.
Figure 5:
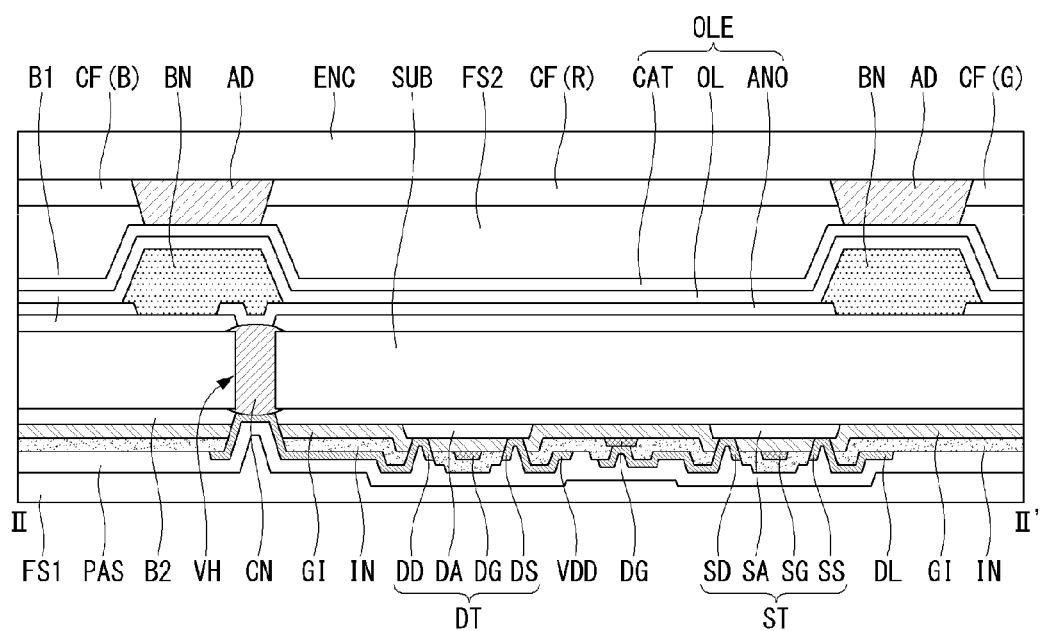
FIG. 5 is a cross sectional view illustrating a structure of the organic light emitting diode display along to the cutting line of II-II' in FIG. 4, according to the second embodiment of the present disclosure.

Hereinafter, referring to FIGS. 4 and 5, we will explain about the second embodiment of the present disclosure. FIG. 4 is a plane view illustrating a structure of an organic light emitting diode display in which the front surface of the substrate is connected to the rear surface of the substrate via a through hole, according to the second embodiment of the present disclosure. FIG. 5 is a cross sectional view illustrating a structure of the organic light emitting diode display along to the cutting line of II-II' in FIG. 4, according to the second embodiment of the present disclosure.

Referring to FIG. 4, an organic light emitting diode display according to the second embodiment of the present disclosure comprises a substrate including a front surface on which a plurality of the organic light emitting diode OLE is arrayed in a matrix manner, and a rear (or back) surface on which a plurality of the thin film transistors ST and DT is arrayed. In the plane view, in order to distinguish the front surface from the rear surface, the elements disposed on the rear surface are drawn as the dotted or dashed lines.

On the rear surface of the substrate, a scan line SL, a data line DL and a current driving line VDD are disposed. A pixel area is defined as a rectangular shape surrounded by the scan line SL, the data line DL and the current driving line VDD. Within the pixel area, a switching thin film transistor ST and the driving thin film transistor DT are formed.

The switching thin film transistor ST includes a switching gate electrode SG, a switching source electrode SS, a switching drain electrode SD and a switching semiconductor layer SA. The switching gate electrode SG is branched from or connected to the scan line SL. The switching source electrode SS is branched from or connected to the data line DL. The switching drain electrode SD is apart from and facing to the switching source electrode SS with a predetermined distance, based on the switching gate electrode SG there-between. The switching semiconductor layer SA is disposed as crossing the switching gate electrode SG from one side connecting to the switching source electrode SS to the other side connecting to the switching drain electrode SD.

The driving thin film transistor DT includes a driving gate electrode DG, a driving source electrode DS, a driving drain electrode DD and a driving semiconductor layer DA. The driving gate electrode DG is connected to the switching drain electrode SD of the switching thin film transistor ST. The driving source electrode DS is branched from or connected to the current driving line VDD. The driving drain electrode DD is apart from and facing to the driving source electrode DS with a predetermined distance, based on the driving gate electrode DG there-between. The driving semiconductor layer DA is disposed as crossing the driving gate electrode DG from one side connecting to the driving source electrode DS to the other side connecting to the driving drain electrode DD.

The driving drain electrode DD is connected to an anode electrode ANO formed on the front surface of the substrate by a connecting electrode CN filling a through-hole VH penetrating the substrate. The anode electrode ANO has a rectangular shape occupying the maximum area of the pixel area defined on the front surface of the substrate.

The circumference portions of the anode electrode ANO is covered by a bank BN. The bank BN divides each pixel areas as disposing between two neighboring pixel areas. The middle portions of the anode electrode ANO surrounded by the bank BN is defined as the emission area. On the anode electrode ANO, an organic light emitting layer and the cathode electrode are stacked. Therefore, within the emission area, the organic light emitting diode OLE is formed as stacking the anode electrode ANO, the organic light emitting layer and the cathode electrode. The organic light emitting diode OLE surrounded by the bank defines the aperture ratio.

The through-hole VH is disposed where the bank BN is placed within the anode electrode ANO. Therefore, the connecting electrode CN filling the through-hole VH is covered by the bank BN. As the results, the most area of the anode electrode ANO defined by the open area which is not covered by the bank BN has the surface having highly even condition. In addition, the organic light emitting diode OLE formed by stacking the organic light emitting layer and the cathode electrode on the anode electrode ANO has no any unexpected defects.

Further referring to FIG. 5, we will explain about the cross sectional structure of the organic light emitting diode display according to the first embodiment of the present disclosure. As shown in FIG. 5, the through-hole VH is disposed as penetrating from the rear surface (lower portion of the figure) to the front surface (upper portion of the figure) of the substrate SUB. The connecting electrode CN filling the through-hole VH may have bumped portions extruded upward and downward from the front surface and the rear surface, respectively. According to the embodiment of present invention, the protruded bumped portions may improve the electrical connecting property between the connecting electrode and the connecting element of the front surface and the rear surface, as a result ensuring the steady electrical connections. At the same time, considering that the connecting electrode with the bumped portions further overlap (or at least partially overlap) with the bank, the connecting electrode with such structures may not only ensure good electrical connecting property but also ensure the flat anode electrode.

On the rear surface of the substrate SUB, a second buffer layer B2 is deposited on the whole surface. The second buffer layer B2 is for making the rear surface of the substrate SUB which is not uneven by the connecting electrode CN, to have highly even condition. On the second buffer layer B2, a scan line SL, a data line DL, a current driving line VDD, a switching thin film transistor ST and a driving thin film transistor are formed. In this figure, the thin film transistors ST and DT have the top gate structure. However, the thin film transistors ST and DT may be other structure such as bottom gate structure.

For the case of top gate structure, on the second buffer layer B2, the switching semiconductor layer SA and the driving semiconductor layer DA are formed. A gate insulating layer GI is deposited on the switching semiconductor layer SA and the driving semiconductor layer DA. On the gate insulating layer GI, the switching gate electrode SG and the driving gate electrode DG are formed. The switching gate electrode SG is overlapped with the middle portions of the switching semiconductor layer SA. The driving gate electrode DG is overlapped with the middle portions of the driving semiconductor layer DA.

An intermediate insulating layer IN is deposited on the gate electrodes SG and DG as covering the whole surface of the substrate SUB. On the intermediate insulating layer IN, the switching source electrode SS, the switching drain electrode SD, the driving source electrode DS and the driving drain electrode DD are formed. The switching source electrode SS and the switching drain electrode SD contact one side and the other side of the switching semiconductor layer SA, respectively, through the intermediate insulating layer IN and the gate insulating layer GI. The driving source electrode DS and the driving drain electrode DD contact one side and the other side of the driving semiconductor layer DA, respectively, through the intermediate insulating layer IN and the gate insulating layer GI.

Further, the switching drain electrode SD contacts the driving gate electrode DG through the intermediate insulating layer IN. The driving drain electrode DD contacts the connecting electrode CN through the intermediate insulating layer IN, the gate insulating layer GI and the first buffer layer B1.

A first organic seal layer FS1 or a passivation layer is deposited on the rear surface where the various lines SL, DL and VDD and thin film transistors ST and DT are formed. The first organic seal layer FS1 is for protecting the driving elements from the exterior environments. Not shown in figures, a protective film may be attached on the first organic seal layer FS1.

A first buffer layer B1 is deposited on the front surface of the substrate SUB as covering the whole surface. The first buffer layer B1 makes the uneven front surface by the connecting electrode CN have highly even condition. On the first buffer layer B1, the anode electrode ANO is formed. It is preferable that the anode electrode ANO includes a metal material having low resistance property. Further, it is preferable that the anode electrode ANO has the maximum area in the pixel area defined by the scan line SL, the data line DL and the current driving line VDD.

The bank BN is disposed between two neighboring anode electrodes ANO. The emission area of the organic light emitting diode OLE is defined by the bank BN. On the front surface of the substrate SUB where the bank BN is formed, the organic light emitting layer OL and the cathode electrode CAT are sequentially disposed. At the emission area defined by the bank BN, as the anode electrode ANO, the organic light emitting layer OL and the cathode electrode CAT are stacked, the organic light emitting diode OLE is formed.

It is preferable that the bank BN is disposed as fully covering the through-hole VH and the connecting electrode CN. For example, the through-hole VH and the connecting electrode CN is preferably located as closing one side of the anode electrode ANO so as to be fully covered by the bank BN. As the results, the uneven surface portions by the through-hole VH and the connecting electrode CN are covered by the bank BN. Therefore, the organic light emitting layer OL and the cathode electrode CAT are not stacked on the portions of the anode electrode ANO covering the through-hole VH and the connecting electrode CN, so that the organic light emitting diode OLE is not formed on the through-hole VH and the connecting electrode CN.

The substrate SUB having the thin film transistors ST and DT and the organic light emitting diode OLE is joined with an en-cap ENC. Between the substrate SUB and en-cap ENC, a second organic seal layer FS2 may be disposed. Here, in order to ensure the even gap between the substrate SUB and the en-cap ENC, a plurality of spacers (not shown in figure) may be further included. In the organic light emitting diode display shown in FIG. 5, an auxiliary line AD having spacer function is included.

As shown in FIG. 5, it is preferable that the auxiliary line AD is disposed as facing with the bank BN. Further it is preferable that the auxiliary line AD is formed as having a mesh shape like the shape of the bank BN. As joining the en-cap ENC with the substrate SUB, the auxiliary line AD directly contact the cathode electrode CAT. The auxiliary line AD is patterned in a mesh manner by which the emission areas are opened. At the emission area between each of the auxiliary line AD, a color filter CF may be disposed. The color filter CF has any one of the red color filter CFR, the green color filter CFG and the blue color filter CFB corresponding to any one of pixel area.

According to the auxiliary electrode of present disclosure, the auxiliary electrode may be directly disposed on and directly contact with the cathode, without any other layers (e.g. an insulation layer) interposed therebetween. With such structure, the reduction of the surface resistance of the cathode can be achieved without increasing masking process or manufacturing process. Therefore, producing costs can be saved and the productivity can be enhanced.

According to the second embodiment of the present disclosure, the lights of the organic light emitting diode display are irradiated to the en-cap ENC. That is, the lights are radiated from the anode electrode ANO to the cathode electrode CAT of the organic light emitting diode OLE. In this case, the anode electrode ANO may include a metal material having lower resistance and high light reflection property. On the contrary, the cathode electrode CAT preferably includes a transparent conductive material such as the indium-gallium-zinc oxide (IGZO). The transparent conductive material has relatively higher resistance than the metal material. Therefore, when the first embodiment is applied to the large area flat panel display, the high resistance of the cathode electrode CAT may cause the degradation of the video quality. To solve this problem, the auxiliary line AD is preferably made of metal material and directly contacts the cathode electrode CAT.

By disposing the organic light emitting diode on the front surface and the driving element on the rear surface of the substrate, the first embodiment of the present disclosure suggests the organic light emitting diode display having high aperture ratio. By disposing the through-hole and the connecting electrode for linking the organic light emitting diode disposed on the front surface to the driving elements disposed on the rear surface within the bank area, the second embodiment of the present disclosure suggests the large area and/or ultra high resolution organic light emitting diode formed on the surface having the high even planar condition. Further, by disposing the auxiliary line corresponding to the bank area on the en-cap, the resistance of the cathode electrode is lowered. As the results, the first embodiment suggests the organic light emitting diode display having the high aperture ratio and the superior video quality.

In the above explain, in convenience, the through-hole VH and the connecting electrode CN are disposed under the bank BN corresponding to the current driving line VDD and/or the data line DL. However, it is not restricted. In other cases, the through-hole VH and the connecting electrode CN may be disposed under the bank BN corresponding to the scan line SL.

As the through-hole VH and the connecting electrode CN are covered by the bank BN, the portions of the anode electrode ANO exposed by the bank BN have highly even planar conditions. Therefore, the organic light emitting layer OL stacked on the anode electrode ANO also have the high even planar conditions. By keeping the high even planar condition, the light emitting efficiency of the organic light emitting layer OL would be superior.

Third Embodiment

Figure 6:
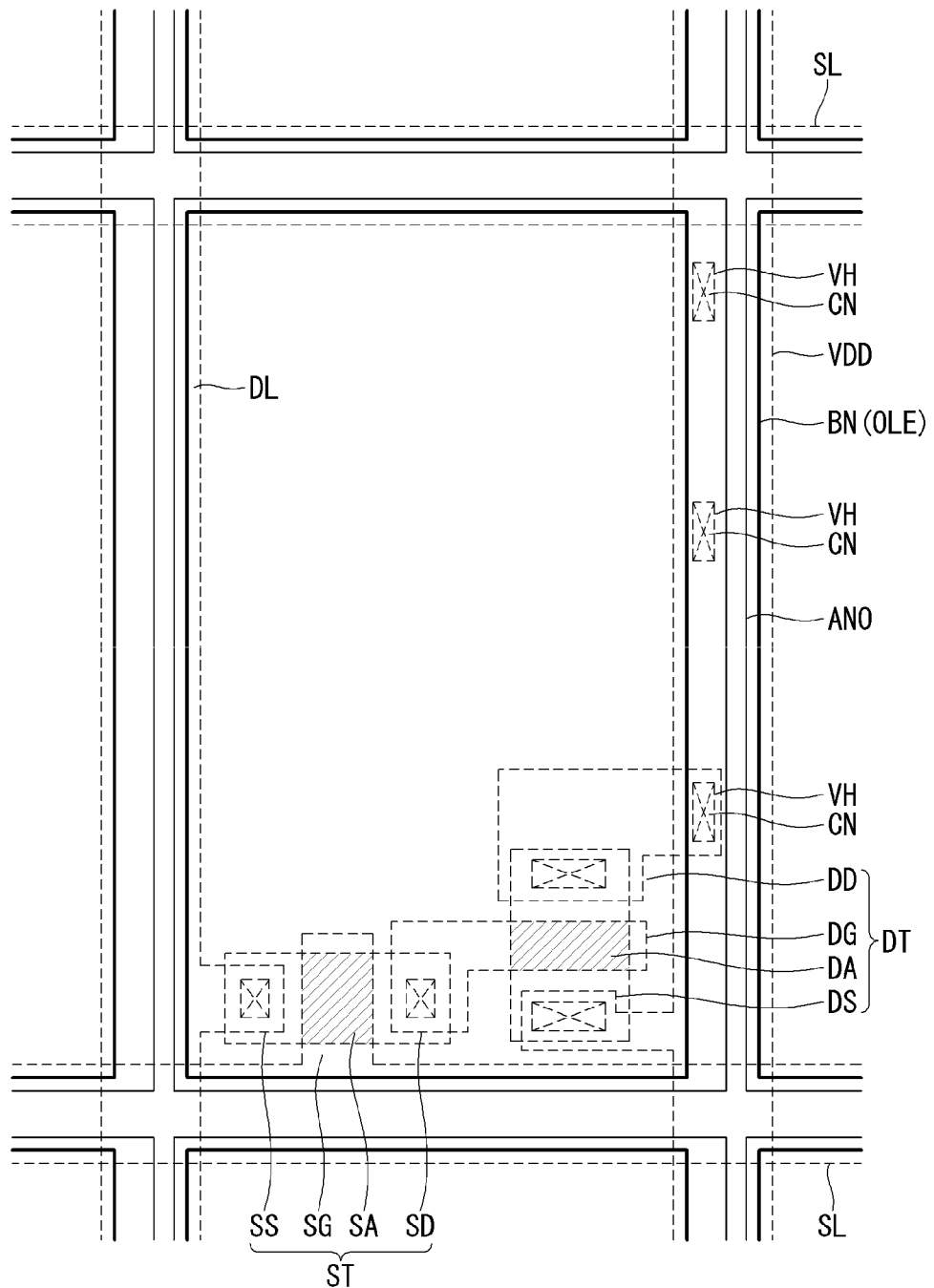
FIG. 6 is a plan view illustrating a structure of an organic light emitting diode display in which the front surface of the substrate is connected to the rear surface of the substrate via a through hole, according to the third embodiment of the present disclosure.

Hereinafter, referring to FIG. 6, we will explain about the third embodiment of the present disclosure. FIG. 6 is a plane view illustrating a structure of an organic light emitting diode display in which the front surface of the substrate is connected to the rear surface of the substrate via a through hole, according to the third embodiment of the present disclosure.

The organic light emitting diode display according to the third embodiment of the present disclosure as shown in FIG. 6 is very similar with that of the second embodiment. The difference is that a plurality of the through-hole VH and the connecting electrode CN are disposed in the third embodiment.

The organic light emitting diode display according to the third embodiment of the present disclosure has a structure in which the driving drain electrode DD of the driving thin film transistor DT. Further, a plurality of the through-hole VH and the connecting electrode CN is arrayed corresponding to the driving drain electrode DD, along to the side of the anode electrode ANO with a predetermined distance. Having many of the connecting electrodes CN for linking the driving thin film transistor DT to the anode electrode ANO, when penetrating the substrate SUB, the connection resistance would be lowered than the case of the single connecting electrode CN. The organic light emitting diode display according to the third embodiment suggests the superior video quality.

In the third embodiment, in convenience, the through-hole VH and the connecting electrode CN are disposed under the bank BN corresponding to the current driving line VDD and/or the data line DL. However, it is not restricted. In other cases, the through-hole VH and the connecting electrode CN may be disposed under the bank BN corresponding to the scan line SL.

As the through-hole VH and the connecting electrode CN are covered by the bank BN, the portions of the anode electrode ANO exposed by the bank BN have highly even planar conditions. Therefore, the organic light emitting layer OL stacked on the anode electrode ANO also have the high even planar conditions. By keeping the high even planar condition, the light emitting efficiency of the organic light emitting layer OL would be superior.

In the second and third embodiments, we explain about main features of the flat panel display using the organic light emitting diode display. However, the main features of the present disclosure may be applied to other type flat panel display such as the non-organic light emitting diode display.

Fourth Embodiment

Figure 7:
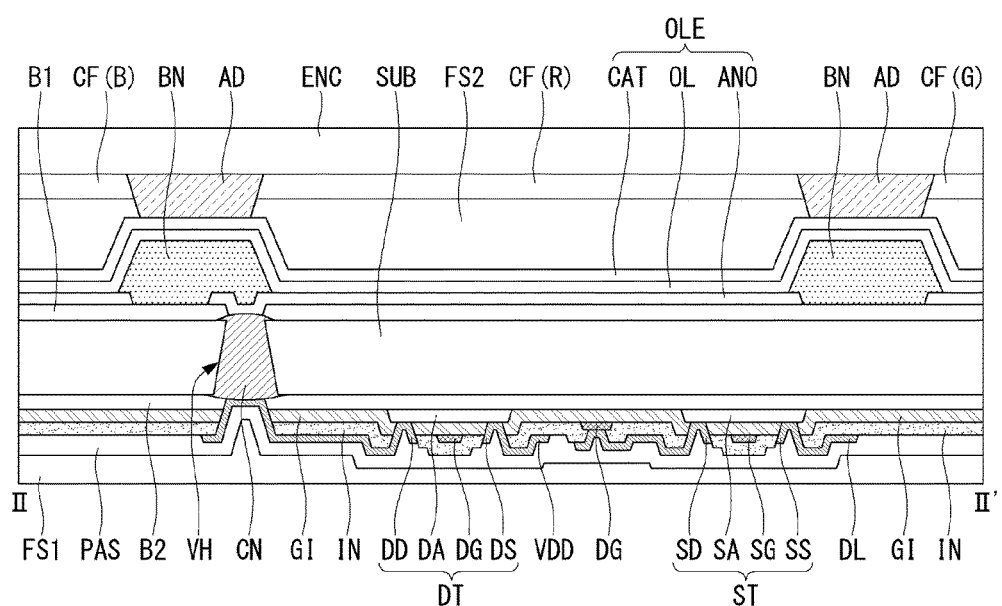
FIG. 7 is a cross sectional view illustrating a structure of an organic light emitting diode display in which the front surface of the substrate is connected to the rear surface of the substrate via a through hole, according to the fourth embodiment of the present disclosure.

Hereinafter, referring to FIG. 7, we explain about the fourth embodiment of the present disclosure. FIG. 7 is a cross sectional view illustrating a structure of an organic light emitting diode display in which the front surface of the substrate is connected to the rear surface of the substrate via a through hole, according to the fourth embodiment of the present disclosure.

The through-hole VH according to the fourth embodiment of the present disclosure has a tapered (e.g. trapezoid) shape. For example, the size of the front hole formed on the front surface of the substrate SUB is smaller than the size of the rear hole formed on the rear surface of the substrate SUB. As the front hole has the smaller size, the size of the through-hole VH covered by the bank BN may be minimized. At the same time, as the rear hole has the larger size, the resistance of the connecting electrode CN may be ensured the low resistance. Therefore, the size of the bank BN is minimized so that the maximized aperture ratio can be ensured.

Otherwise, the size of the front hole formed at the front surface of the substrate SUB may be larger than the size of the rear hole formed at the rear surface of the substrate SUB. In this case, contrary to the above case, it is hard to ensure the maximized aperture ratio. However, when it is required that the contact resistance between the anode electrode ANO and the connecting electrode CN would be lowered, it is preferable that the front hole has the larger size than the rear hole.

It will be apparent to those skilled in the art that various modifications and variations can be made in the display of the present disclosure without departing from the technical idea or scope of the disclosure. Thus, it is intended that the present disclosure cover the modifications and variations of this disclosure provided they come within the scope of the appended claims and their equivalents.

What is claimed is:

1. A display device, comprising:
a substrate;
a driver element disposed on a first surface of the substrate;
a light emitting element disposed on a second surface of the substrate;
a through-hole penetrating the substrate from the first surface to the second surface; and
a connecting electrode filling the through-hole for linking the driving element to the light emitting element,
wherein the light emitting element is organic light emitting diode, the organic light emitting diode includes:
an anode electrode disposed in a matrix manner on the first surface;
a bank covering circumference areas of the anode electrode;
an organic light emitting layer on the anode electrode exposed by the bank; and
a cathode electrode disposed on the organic light emitting layer,
wherein the through-hole and the connecting electrode are disposed as overlapping with the bank, and
wherein the bank is disposed as fully covering the through-hole and the connecting electrode.

2. The display device according to the claim 1, wherein the driving element includes:
a scan line running to a first direction on the second surface;
a data line and a current driving line running to a second direction on the second surface;
a switching thin film transistor connecting between the scan line and the data line; and
a driving thin film transistor connecting between the switching thin film transistor and the current driving line, and
wherein the driving thin film transistor connects to the connecting electrode.

3. The display device according to the claim 1, further comprising:
an en-cap joined to the first surface of the substrate;
a plurality of an auxiliary line disposed on the en-cap as facing to the bank; and
a color filter disposed between two neighboring auxiliary lines,
wherein the auxiliary lines contact the cathode electrode.

4. The display device according to the claim 1, wherein the through-hole and the connecting electrode comprise a plurality of through holes and connecting electrodes, and the plurality of the through-hole and the connecting electrode is disposed along the bank.

5. The display device according to the claim 1, wherein the through-hole and the connecting electrode comprise a plurality of through holes and connecting electrodes, and the plurality of the through-hole and the connecting electrode are disposed overlapping the bank along one side of a vertical circumference of the anode electrode.

6. The display device according to the claim 1, wherein the through-hole and the connecting electrode comprise a plurality of through holes and connecting electrodes, and the plurality of the through-hole and the connecting electrode are disposed overlapping the bank along one side of a horizontal circumference of the anode electrode.

7. The display device according to the claim 1, wherein the through-hole includes:
a first hole disposed on the first surface; and
a second hole disposed on the second surface,
wherein the first hole has the same size of the second hole.

8. The display device according to the claim 1, wherein the through-hole includes:
a first hole disposed on the first surface; and
a second hole disposed on the second surface,
wherein the first hole is larger than the second hole.

9. The display device according to the claim 1, wherein the through-hole includes:
a first hole disposed on the first surface; and
a second hole disposed on the second surface,
wherein the first hole is smaller than the second hole.

10. The display device according to claim 1, wherein at least a part of the through-hole overlaps a bank of the light emitting element.

11. The display device according to claim 1, wherein the connecting electrode filling the through-hole have bumped portions extruded upward and downward from the first surface and the second surface, respectively.

12. The display device according to the claim 3, wherein the auxiliary line is directly disposed on and contact the cathode, without other layers interposed therebetween.

* * * * *